United States Patent [19]

Bethea et al.

[11] Patent Number: 4,754,131

[45] Date of Patent: Jun. 28, 1988

[54] DEVICES USING AVALANCHE PHOTODIODE AND CAPABLE OF DETECTING A SMALL NUMBER OF PHOTONS

[75] Inventors: Clyde G. Bethea, Plainfield; Barry F. Levine, Livingston, both of N.J.

[73] Assignee: American Telephone and Telegraph Company, AT&T Bell Laboratories, Murray Hill, N.J.

[21] Appl. No.: 814,962

[22] Filed: Dec. 31, 1985

[51] Int. Cl.⁴ .............................................. H01J 40/14
[52] U.S. Cl. .................................... 250/211 J; 357/30
[58] Field of Search ....... 250/214 R, 214 AG, 211 R, 250/211 J; 357/30 A, 30 D, 30 H, 19, 16, 17

[56] References Cited

U.S. PATENT DOCUMENTS

| | | | |
|---|---|---|---|
| 4,236,069 | 11/1980 | Laughlin | 250/214 R |
| 4,561,007 | 12/1985 | Webb | 357/30 A |
| 4,587,544 | 5/1986 | Webb | 357/16 |

Primary Examiner—David C. Nelms
Assistant Examiner—Jessica Ruoff
Attorney, Agent, or Firm—Richard D. Laumann

[57] ABSTRACT

An avalanche photodetector having separate absorption and multiplication regions comprising Group III-V compound semiconductors is useful as a detector of small numbers of photons when it is operated with an above threshold bias voltage at ambient temperature.

8 Claims, 1 Drawing Sheet

DEVICES USING AVALANCHE PHOTODIODE AND CAPABLE OF DETECTING A SMALL NUMBER OF PHOTONS

TECHNICAL FIELD

This invention relates generally to avalanche photodetectors and particularly to devices using such photodetectors which are biased above breakdown and capable of detecting small numbers of photons while operating at room temperature.

BACKGROUND OF THE INVENTION

Devices capable of detecting light, commonly referred to as photodetectors, are important in many areas of modern technology. For example, they are essential components of optical communications systems. Such systems have a light source and a photodetector optically coupled to each other by means of a glass transmission line which is commonly termed an optical fiber. Information is transmitted through the fiber in the form of light pulses. In such systems, as well as in other applications, it is desirable to have highly sensitive photodetectors because such photodetectors, for example, permit longer distances between the light source and photodetector thus requiring, e.g., fewer repeaters for the system. Of course, highly sensitive photodetectors are useful in many other applications. For example, optical time domain reflectometers are used to measure some characteristics of glass transmission lines.

The ultimate photodetectors, in terms of quantum efficiency, would be a detector capable of detecting a single photon. However, many types of photodetectors are not even theoretically capable of detecting single photons. For example, a p-i-n photodiode, which is commonly used in optical communications systems, has no gain and thus, the absorption of a single photon results in only a single electron-hole pair which must be detected by external circuitry. However, the dark current that arises from the thermal generation of carriers is sufficiently large to mask a single electron-hole pair. The limitation in sensitivity imposed by the one-to-one correspondence between the number of absorbed photons and the number of electron-hole pairs can be avoided if the photodetector exhibits gain, i.e., more than one electron-hole pair ultimately results from each absorbed photon.

Accordingly, much effort has been directed toward developing photodetectors that exhibit gain. One such photodetector is the avalanche photodiode. In such photodiodes, carriers impact ionize to generate more carriers which in turn ionize, etc., thus lending to avalanche multiplication. Such devices are operated at reverse bias voltages that are sufficiently high to ensure that avalanche multiplication, leading to gain, occurs. Above a certain voltage, commonly termed the breakdown voltage, the multiplication becomes extremely large.

However, there are several reasons why avalanche photodetectors are not easily used to detect small numbers of photons. For example, there is also a dark current present which results from the necessity of biasing the device. There are variations in the magnitude of the dark current and these variations are typically sufficiently large, at least when the device is operated at noncryogenic temperatures, so that the additional current resulting from the absorption of the single photon is undetectable. It should be remembered that the dark current also undergoes avalanche multiplication and that the size of the dark current typically increases as the energy bandgap decreases.

However, attempts have been made to use avalanche photodetectors in situations where they are capable of detecting small numbers of photons, i.e., photon counting. These attempts have used a time varying potential, i.e., a gated potential, periodically above breakdown to achieve high sensitivity. For example, U.S. Pat. No. 4,303,861 issued on Dec. 1, 1981, describes one such photon counting system. The system described operated the photodetector at a bias in excess of the avalanche potential, i.e., at a bias above the breakdown voltage. The photodetector was a Schottky barrier diode. The system was cooled to cryogenic temperatures so that the avalanche process occurred only when photons were absorbed. Upon detection of the avalanche, the bias voltage was reduced to a value below the avalanche potential to quench the avalanche.

However, for most applications, room temperature operation is desired. This is difficult, especially at relatively long wavelengths, because of the size of the dark current. Room temperature operation and sensitivity at long wavelengths would lead to a device that might have many applications as, for example, in the optical time domain reflectometer previously mentioned. This is an instrument which sends an optical pulse into an optical fiber and measures the time until a reflection returns. This measures, potentially with high precision, the length of the fiber together with other transmission line characteristics such as splice losses.

Long wavelength avalanche photodetectors often use Group III-V compound semiconductors because of their relatively low bandgaps. However, such semiconductors appear undesirable for photon counting avalanche phtodetector operation at room temperature because of the thermal noise resulting from the low bandgap. Additionally, such devices typically are heterojunction devices with separate absorption and multiplication regions. It might be expected that the interface might have many traps which would also make room temperature operation impossible.

SUMMARY OF THE INVENTION

We have found that an avalanche photodetector comprising Group III-V compound semiconductors and having separate absorption and multiplication regions, when operated in the photon counting mode, will detect a small number of photons at room temperature. The apparatus comprises an avalanche photodetector; means for applying an above breakdown bias to the avalanche photodetector; means for detecting the electrical signal generated by the avalanche and means for quenching the avalanche. The bias may then be restored above breakdown by the means for applying. The apparatus thus comprises means external to the avalanche photodetector for detecting the electrical signal generated by the large avalanche current produced by the absorption of photons. In a preferred embodiment, the apparatus further comprises a light source, and an optical directional coupler connected to said photodetector and light source. The coupler further comprises means for connecting an optical transmission line. The photodetector is further connected to means for analyzing the reflected signal from the optical transmission line.

DETAILED DESCRIPTION

Figure 1:
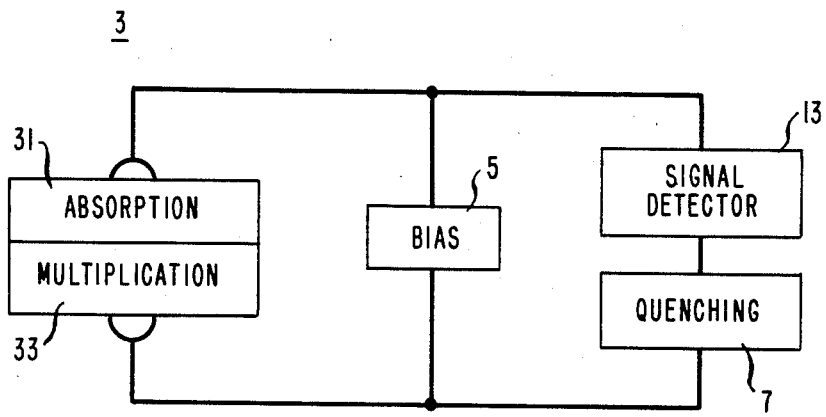
FIG. 1 is a schematic representation of apparatus according to our invention.

Apparatus of an exemplary embodiment of our invention is schematically depicted in FIG. 1. For reasons of clarity, the elements of the apparatus depicted are not shown to scale. The apparatus comprises an avalanche photodetector 3; means for applying an above breakdown bias 5 to the avalanche photodetector; and means for quenching the avalanche by reducing the bias below breakdown, and resensitizing for the next photon by restoring the bias above breakdown. It further comprises means 13 for detecting the electrical signal generated by absorbed photons. The latter means is connected to both the photodetector and the means for quenching. These means are well known to those skilled in the art and need not be described in detail.

The avalanche photodetector has separate absorption and multiplication regions 31 and 33, respectively. These regions comprise low and high bandgap semiconductor materials, respectively. The materials are selected from the group consisting of Group III-V compound semiconductors including InGaAsP. In one exemplary embodiment, the materials are InGaAs and InP. These materials are desirable because they permit the photodetector to be sensitive at wavelengths longer than 1.0 $\mu$m and in particular, at 1.3 and 1.5 $\mu$m. The separate absorption and multiplication structure also enables the device to operate with a relatively small dark current. These devices are now well known to those skilled in the art and need not be described in further detail. The apparatus depicted does not require cryogenic cooling and will operate at ambient temperature although some thermoelectric cooling may be desired to maintain a constant operating temperature.

The above breakdown bias will typically be constant if the pulse arrival time is not known. However, if the arrival time is known, the bias above threshold may be pulsed. An expedient scheme will be described.

The dc bias with a magnitude below the breakdown voltage $V_B$ and a bias pulse $V_p$ are superimposed and bring the total applied bias to a value above breakdown. This activates the avalanche mechanism within the avalanche photodetector for a time equal to the applied pulse width. If it is now hypothesized that a photon arrives during this enabling period and is absorbed, an avalanche is possible and the photon may be detected. When the pulse bias returns to zero, the total bias drops below breakdown voltage and quenches the avalanche and enables the diode to receive the next pulse.

Figure 2:
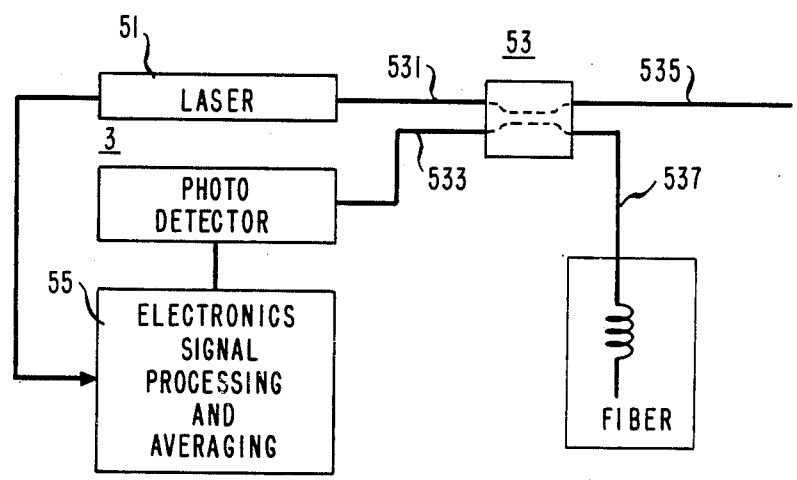
FIG. 2 is a schematic representation of an optical time domain reflectometer according to our invention.

Another embodiment of our invention, which is an optical time domain reflectometer, is depicted in FIG. 2. In addition to the photodetector described with respect to FIG. 1 and means 5 and means 7, it further comprises a semiconductor laser 51 and a bidirectional coupler 53. For reasons of clarity, means 5, 7 and 13 are shown as means 55 for electronics signal processing and averaging. The bidirectional coupler is adapted to be optically connected to both laser and the photodetector at its two input ports, 531 and 533; and one of its two output ports, 535 and 537, is adapted to be connected to, for example, an optical fiber. The other output port is connected to, for example, an indexed matched coupler end. The means for detecting the electrical signals is indicated as 55 and comprises, for example, an amplifier, discriminator and multichannel scaler. This means also quenches the avalanche and restores an above breakdown bias voltage. These elements are well known to those skilled in the art and need not be described in further detail. There is additionally an electrical connection between the laser and means for electronic signal processing and averaging 55. This connection, which is conveniently made to the multichannel scaler, may be omitted if the laser is operated continuously. If present, it enables the laser to operate in a pulsed mode. The apparatus depicted is useful as an optical time domain reflectometer which measures the loss and the location and magnitude of splice losses and breaks in the optical transmission line.

It will be readily appreciated that this poses a stringent requirement on the dark noise because the large duty cycle means that there will be a large average dark current which will fill the traps readily and thereby saturate the detector. For this, as well as other reasons, a Group III-V compound semiconductor avalanche photodetector (APD) is advantageously used as it can be used at room temperature whereas a Ge APD must be cryogenically cooled.

The photodetector may have either a planar or mesa structure. The former is preferred as it may be more easily fabricated with a small area leading to less dark current and noise. Further, its size may be matched to the fiber size.

What is claimed is:

1. Apparatus comprising an avalanche photodetector comprising separate absorption and multiplication regions comprising semiconductors selected from the group consisting of Group III-V compound semiconductors;

means for applying a bias above threshold to said photodetector;

means for detecting the electrical signal generated by an avalanche in said photodetector; and means for quenching said avalanche.

2. Apparatus as recited in claim 1 further comprising means for restoring said bias to above threshold.

3. Apparatus as recited in claim 2 further comprising a laser, and an optical coupler, said optical coupler being connected to said laser and said photodetector and having at least one output port adapted to be connected to an optical fiber.

4. Apparatus as recited in claim 3 in which said Group III-V compound semiconductors are selected from the group consisting of InGaAsP.

5. Apparatus as recited in claim 4 in which said compound semiconductors comprise InGaAs and InP.

6. Apparatus as recited in claim 3 in which said laser and said means for detecting are electrically connected.

7. Apparatus as recited in claim 1 in which the said means for applying bias comprises means for applying a dc bias.

8. Apparatus as recited in claim 1 in which means for applying a bias comprises means for applying a pulsed bias.

* * * * *